US007371592B2

(12) United States Patent
Park et al.

(10) Patent No.: US 7,371,592 B2
(45) Date of Patent: May 13, 2008

(54) MANUFACTURING METHOD OF THIN FILM TRANSISTOR ARRAY PANEL USING AN OPTICAL MASK

(75) Inventors: Jeong-Min Park, Seoul (KR); Hi-kuk Lee, Gyeonggi-do (KR); Woo-Seok Jeon, Seoul (KR); Joo-Han Kim, Gyeonggi-do (KR); Doo-Hee Jung, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 102 days.

(21) Appl. No.: 11/313,150

(22) Filed: Dec. 19, 2005

(65) Prior Publication Data

US 2006/0160279 A1 Jul. 20, 2006

(30) Foreign Application Priority Data

Jan. 17, 2005 (KR) .................... 10-2005-0004272
Jan. 17, 2005 (KR) .................... 10-2005-0004273

(51) Int. Cl.
*H01L 21/66* (2006.01)
(52) U.S. Cl. ..................... 438/22; 438/23; 438/30; 438/48; 438/E51.005
(58) Field of Classification Search ............ 438/22–24, 438/30, 48–50
See application file for complete search history.

(56) References Cited

U.S. PATENT DOCUMENTS 6,306,558 B1    10/2001    Lin 7,250,316 B2 *  7/2007    Soh ................. 438/30
2003/0165749 A1  9/2003    Fritze et al.

FOREIGN PATENT DOCUMENTS

| JP | 08-250407 | 9/1996 |
| JP | 08-254812 | 10/1996 |
| JP | 11-102060 | 4/1999 |
| JP | 2000-035683 | 2/2000 |
| JP | 2001-244191 | 9/2001 |
| JP | 2002-268200 | 9/2002 |
| JP | 2003-029393 | 1/2003 |
| JP | 2004-272228 | 9/2004 |
| KR | 1997-0013064 | 3/1997 |

(Continued)

OTHER PUBLICATIONS

English Language Abstract, KR Patent Publication No. 10-0436181, Jun. 4, 2004, 1 page.

(Continued)

*Primary Examiner*—Dung A. Le
(74) *Attorney, Agent, or Firm*—MacPherson Kwok Chen & Heid LLP

(57) ABSTRACT

A method for manufacturing a thin film transistor array panel using a photo mask is provided. The photo mask includes: a transmitting area and a translucent area, wherein the translucent area includes a plurality of light blocking portions blocking light, and wherein the light blocking portions have a plurality of areas blocking different amounts of light. By using this type of photo mask, a substantially flat layer of photoresist film can be deposited even on top of an uneven surface to manufacture a thin film transistor array panel. The flat photoresist film reduces processing cost and enhances the reliability of the panel manufacturing process.

18 Claims, 15 Drawing Sheets

FOREIGN PATENT DOCUMENTS

| | | |
|---|---|---|
| KR | 10-0309925 | 9/2001 |
| KR | 10-0436181 | 6/2004 |

OTHER PUBLICATIONS

English Language Abstract, KR Patent Publication No. 10-0309925, Sep. 12, 2001, 1 page.

English Language Abstract, KR Patent Publication No. 1997-0013064, Mar. 29, 1997, 1 page.

English Language Abstract, JP Patent Publication No. 2004-272228, Sep. 30, 2004, 1 page.

English Language Abstract, JP Patent Publication No. 2003-029393, Jan. 29, 2003, 1 page.

English Language Abstract, JP Patent Publication No. 2002-268200, Sep. 18, 2002, 1 page.

English Language Abstract, JP Patent Publication No. 2001-244191, Sep. 7, 2001, 1 page.

English Language Abstract, JP Patent Publication No. 2000-035683, Feb. 2, 2000, 1 page.

English Language Abstract, JP Patent Publication No. 11-102060, Apr. 13, 1999, 1 page.

English Language Abstract, JP Patent Publication No. 08-254812, Oct. 1, 1996, 1 page.

English Language Abstract, JP Patent Publication No. 08-250407, Sep. 27, 1996, 1 page.

* cited by examiner

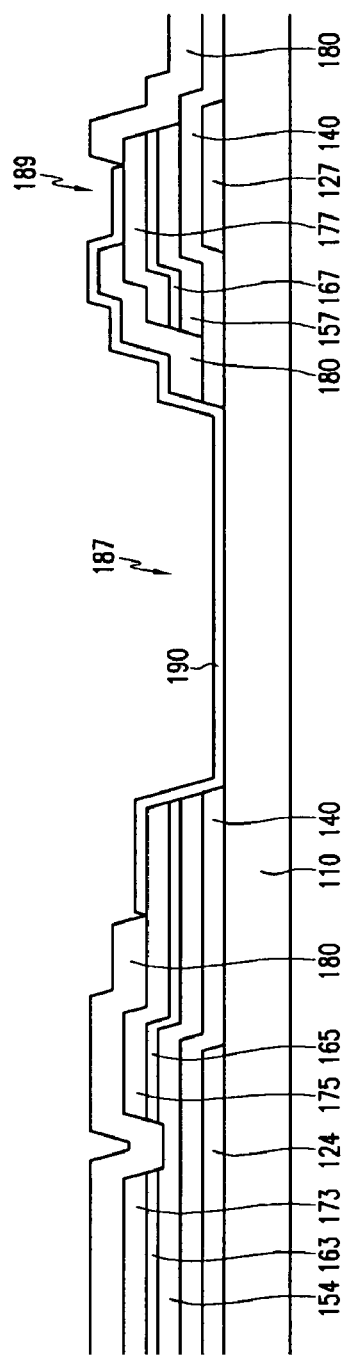
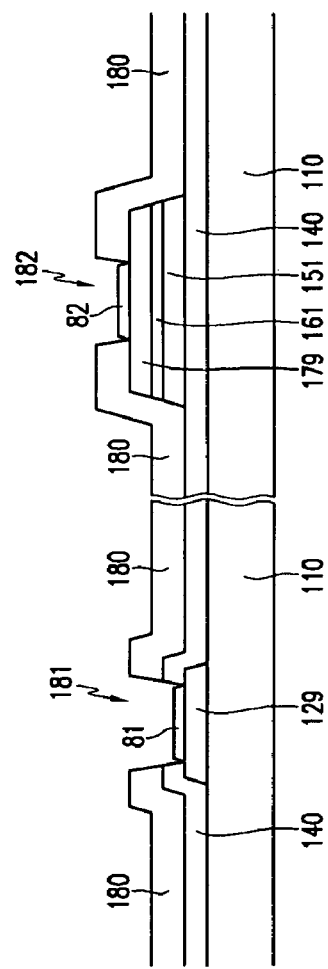
FIG.2A
FIG.2B

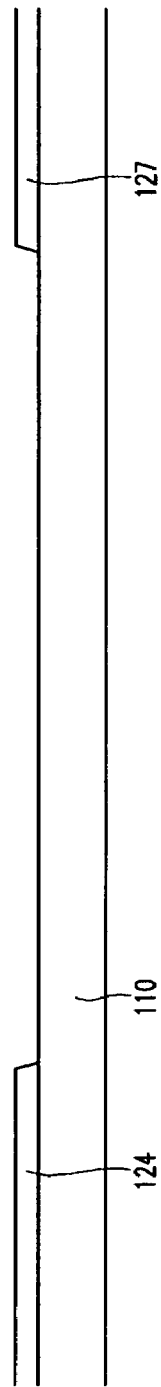
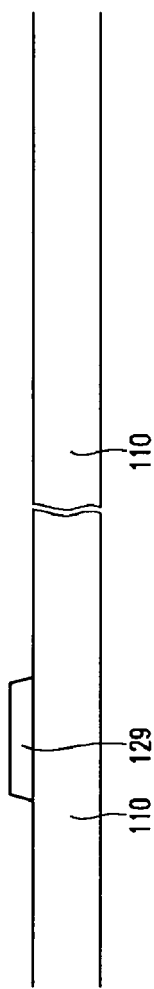

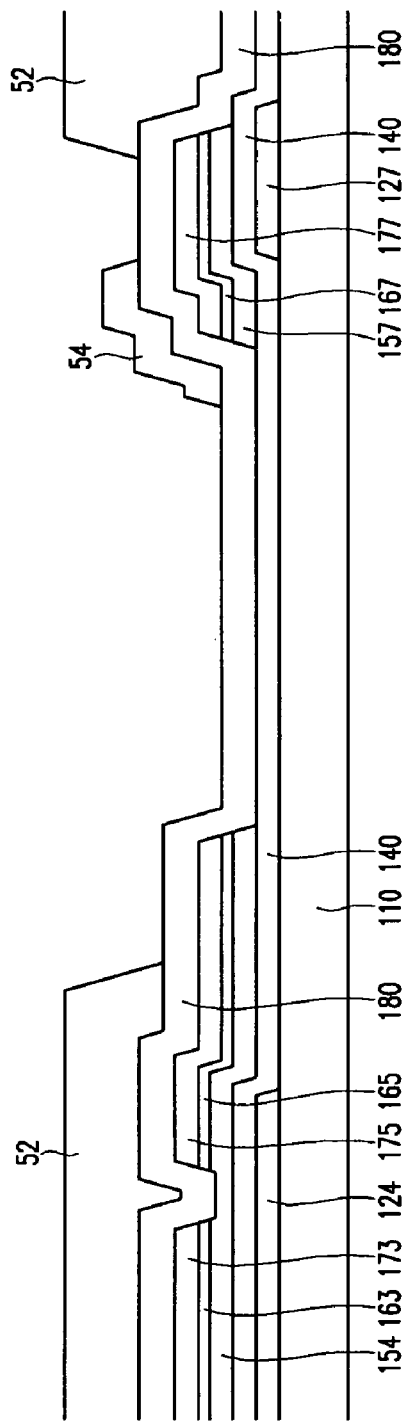
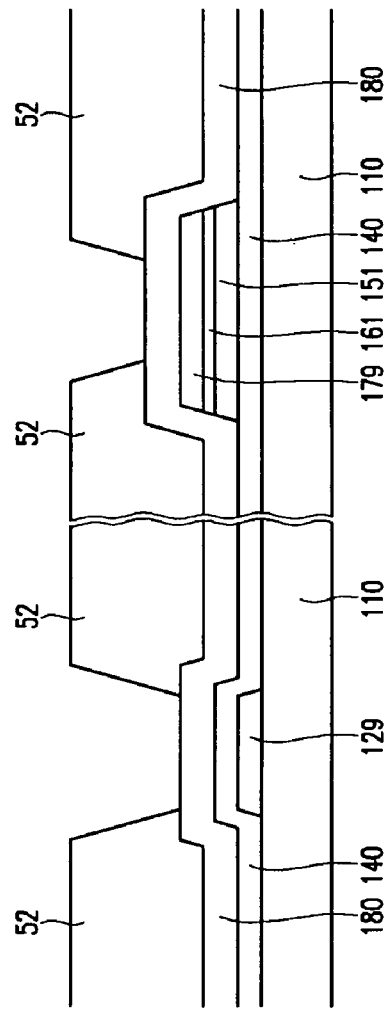
FIG.9A
FIG.9B

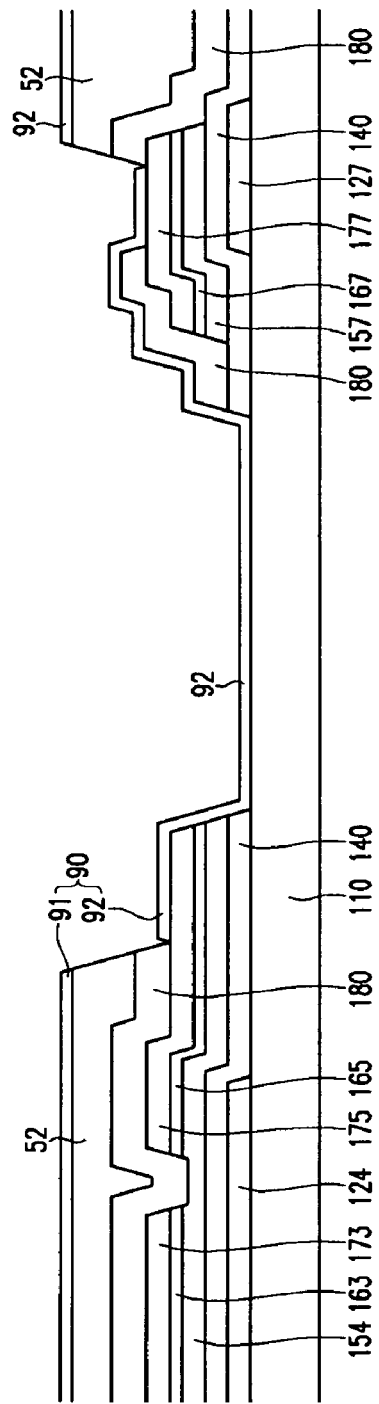
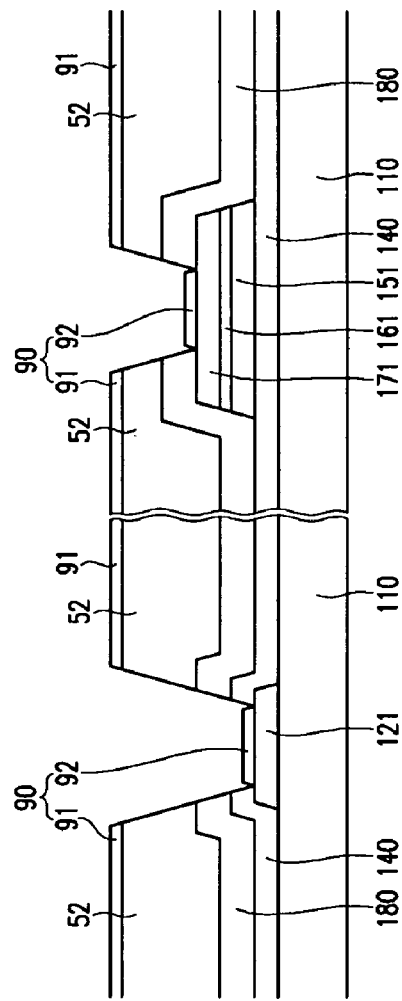
FIG.12A
FIG.12B

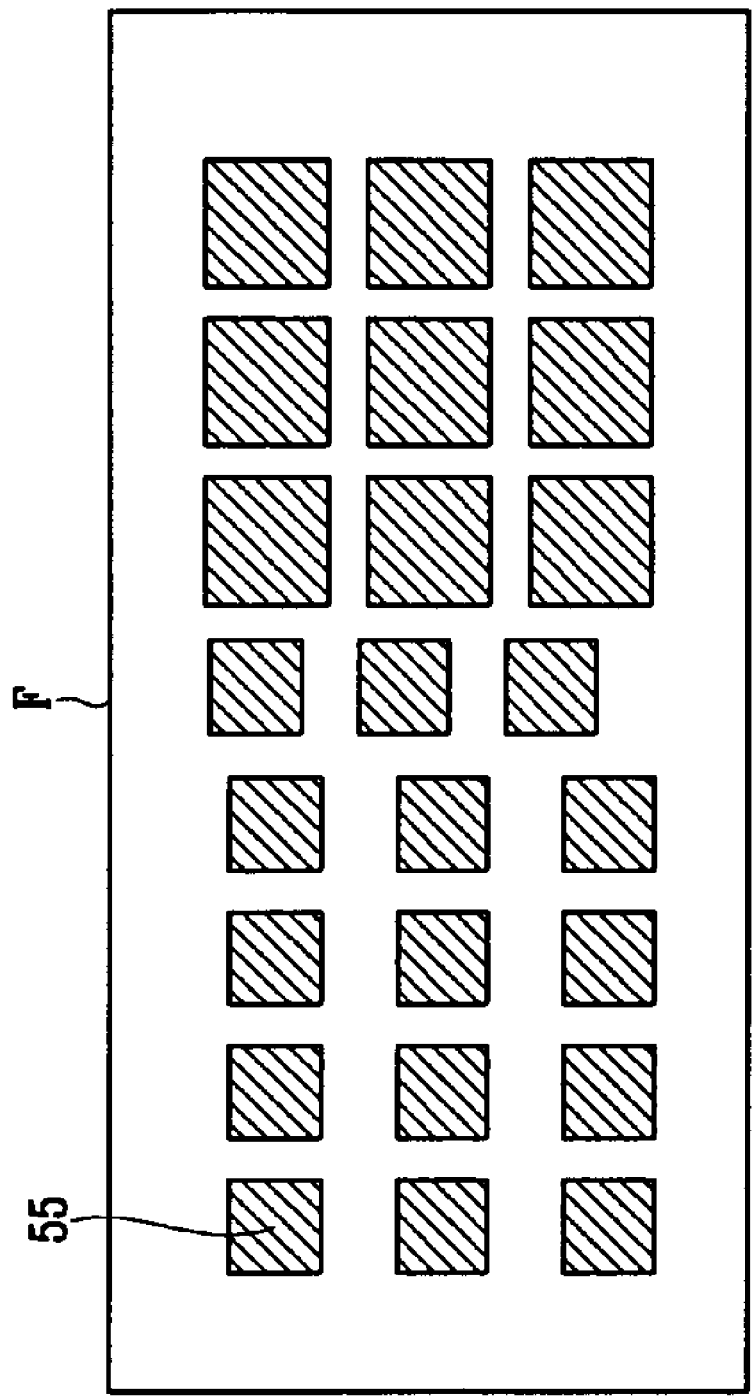

MANUFACTURING METHOD OF THIN FILM TRANSISTOR ARRAY PANEL USING AN OPTICAL MASK

RELATED APPLICATION

This application claims priority from Korean Patent Application Ser. No. 10-2005-004272 filed on Jan. 17, 2005, and Korean Patent Application Ser. No. 10-2005-0004273 filed on Jan. 17, 2005, both of which are incorporated herein by reference in their entirety.

BACKGROUND OF THE INVENTION (a) Field of the Invention

The present invention relates to an optical mask and a manufacturing method of a thin film transistor array panel using an optical mask.

(b) Description of Related Art

An active type display device such as a liquid crystal display (LCD) and an organic light emitting display (OLED) includes a plurality of pixels arranged in a matrix, field generating electrodes, and switching elements. The switching elements include thin film transistors (TFTs) having three terminals, i.e. a gate, a source, and a drain. The TFT of each pixel selectively transmits data signals to the field-generating electrode in response to gate signals.

The display device further includes a plurality of signal lines for transmitting signals to the switching elements, which include gate lines transmitting gate signals and data lines transmitting data signals.

The LCD and the OLED include a panel provided with the TFTs, the field-generating electrodes, and the signal lines, which is referred to as a TFT array panel.

The TFT array panel has a layered structure that includes several conductive layers and insulating layers. The gate lines, the data lines, and the field-generating electrodes are formed of different conductive layers and are separated by insulating layers.

The TFT array panel having the layered structure is manufactured by several lithography steps, following etching steps. Since the lithography requires cost and time, it is desirable to reduce the number of lithography steps.

SUMMARY OF THE INVENTION

A photo mask is provided, which includes a transmitting area; and a translucent area, wherein the translucent area includes a plurality of light blocking portions blocking light, and wherein the light blocking portions have a plurality of areas blocking different amounts of light.

The light blocking portions may be arranged substantially in parallel in a row direction and have a stripe shape.

The respective areas of the light blocking portions may have different widths.

The photo mask may vary an amount of light blocked by adjusting an interval between adjacent light blocking portions.

The photo mask may further include a complete light blocking area.

A method of manufacturing a thin film transistor array panel is provided, which includes forming a gate line on a substrate, forming a first insulating layer on the gate line, forming a semiconductor layer on the first insulating layer, forming a data line, a drain electrode, and a storage capacitor conductor on the semiconductor layer, depositing a second insulating layer on the data line, the drain electrode, and the storage capacitor conductor, forming a photoresist including a first portion and a second portion to be thinner than the first portion on the second insulating layer by exposing it to light through a photo mask and developing, etching the second and first insulating layers using the photoresist as a mask to expose portions of the drain electrode and the storage capacitor conductor and to leave a first portion of the second insulating layer under the second portion of the photoresist, removing the second portion of the photoresist, depositing a conductive film, and removing the second portion of the photoresist to form a pixel electrode connected to the drain electrode and the storage capacitor conductor, wherein the photo mask include a light blocking area, a transmitting area, and a translucent area, and wherein the translucent area includes a plurality of light blocking portions having a plurality of areas at which amounts of light blocked are different from each other.

The respective light blocking portions may have a stripe shape.

The respective areas of the light blocking portions may have different vertical widths.

The respective light blocking portions may include a first area corresponding to a portion adjacent to where a near edge of the storage capacitor conductor is not formed, a second area corresponding to an area near the edge of the storage capacitor conductor, a third area corresponding to a portion of the storage capacitor conductor; a fourth area corresponding to an area near an edge of an expansion of the gate line, and a fifth area corresponding to a portion of the expansion of the gate line.

The first area may have the narrowest vertical width.

The second portion of the photoresist film may be positioned near the edge of the storage capacitor conductor.

The photo mask may vary an amount of light blocked by adjusting an interval between adjacent light blocking portions.

The etching of the second and first insulating layers may expose portions of the data line.

The etching of the second and first insulating layers may expose a portion of the gate line.

A photo mask is provided, which includes a transmitting area, and a translucent area, wherein the translucent area has a plurality of light blocking portions which have a predetermined size and are arranged in a matrix.

The light blocking portions may have different sizes from each other.

The light blocking portions may have the same size and have a different formation density in accordance with formation position.

The respective light blocking portions may have a polygon shape.

The respective light blocking portions may have a rectangular shape.

The respective light blocking portions may have a triangular shape.

The respective light blocking portions may have a lozenge shape.

The respective light blocking portions may have a circular shape.

The respective light blocking portions may have an elliptical shape.

The photo mask may further include a light blocking area.

A method of manufacturing a thin film transistor array panel is provided, which includes forming a gate line on a substrate, forming a first insulating layer on the gate line, forming a semiconductor layer on the first insulating layer, forming a data line, a drain electrode, and a storage capacitor conductor on the semiconductor layer, depositing a second insulating layer on the data line, the drain electrode, and the storage capacitor conductor, forming a photoresist including a first portion and a second portion thinner than the first portion on the second insulating layer by exposing it to light through a photo mask and developing; etching the second and first insulating layers using the photoresist as a mask to expose portions of the drain electrode and the storage capacitor conductor and to leave a first portion of the second insulating layer under the second portion of the photoresist, removing the second portion of the photoresist, depositing a conductive film; and removing the second portion of the photoresist to form a pixel electrode connected to the drain electrode and the storage capacitor conductor, wherein the photo mask include a light blocking area, a transmitting area, and a translucent area, and wherein the translucent area has a plurality of light blocking portions which have a predetermined size and are arranged in a matrix.

The light blocking portions may have different sizes from each other.

The light blocking portions may have the same size and have different formation densities in accordance with formation position.

The respective light blocking portions may have a polygon shape.

The respective light blocking portions may have a rectangular shape.

The respective light blocking portions may have a circular shape.

The second portion of the photoresist may be positioned near an edge of the storage capacitor conductor.

The etching of the second and first insulating layers may expose portions of the data line and the drain electrode.

The etching of the second and first insulating layers may expose a portion of the gate line.

BRIEF DESCRIPTION OF THE DRAWINGS

The present invention will become more apparent by describing embodiments thereof in detail with reference to the accompanying drawings, in which:

FIG. 2A is a sectional view of the TFT array panel shown in FIG. 1 taken along the line IIA-IIA';

FIG. 2B is a sectional view of the TFT array panel shown in FIG. 1 taken along the lines IIB-IIB' and IIB'-IIB";

FIG. 4A is a sectional view of the TFT array panel shown in FIG. 3 taken along the line IVA-IVA';

FIG. 4B is a sectional view of the TFT array panel shown in FIG. 3 taken along the lines IVB-IVB' and IVB'-IVB";

FIG. 5A is a sectional view of the TFT array panel shown in FIG. 3 taken along the line IVA-IVA' and FIG. 5B is a sectional view of the TFT array panel shown in FIG. 3 taken along the lines IVB-IVB' and IVB'-IVB";

FIG. 8A is a sectional view of the TFT array panel shown in FIG. 6 taken along the line VIIA-VIIA' and FIG. 8B is a sectional view of the TFT array panel shown in FIG. 6 taken along the lines VIIB-VIIB' and VIIB'-VIIB";

FIGS. 9A and 9B illustrate the step following the step shown in FIGS. 8A and 8B, where FIG. 9A is a sectional view of the TFT array panel shown in FIG. 6 taken along the line VIIA-VIIA' and FIG. 9B is a sectional view of the TFT array panel shown in FIG. 6 taken along the lines VIIB-VIIB' and VIIB'-VIIB";

FIG. 10A is a sectional view of the TFT array panel shown in FIG. 6 taken along the line VIIA-VIIA' and FIG. 10B is a sectional view of the TFT array panel shown in FIG. 6 taken along the lines VIIB-VIIB' and VIIB'-VIIB";

FIG. 11A is a sectional view of the TFT array panel shown in FIG. 6 taken along the line VIIA-VIIA' and FIG. 11B is a sectional view of the TFT array panel shown in FIG. 6 taken along the lines VIIB-VIIB' and VIIB'-VIIB";

FIGS. 12A and 12B illustrate the step following the step shown in FIGS. 11A and 11B, where FIG. 12A is a sectional view of the TFT array panel shown in FIG. 6 taken along the line VIIA-VIIA' and FIG. 12B is a sectional view of the TFT array panel shown in FIG. 6 taken along the lines VIIB-VIIB' and VIIB'-VIIB";

FIG. 14 is a plan view of a portion of a translucent area of a photo mask according to another embodiment of the present invention.

DETAILED DESCRIPTION OF EMBODIMENTS

Figure 1:
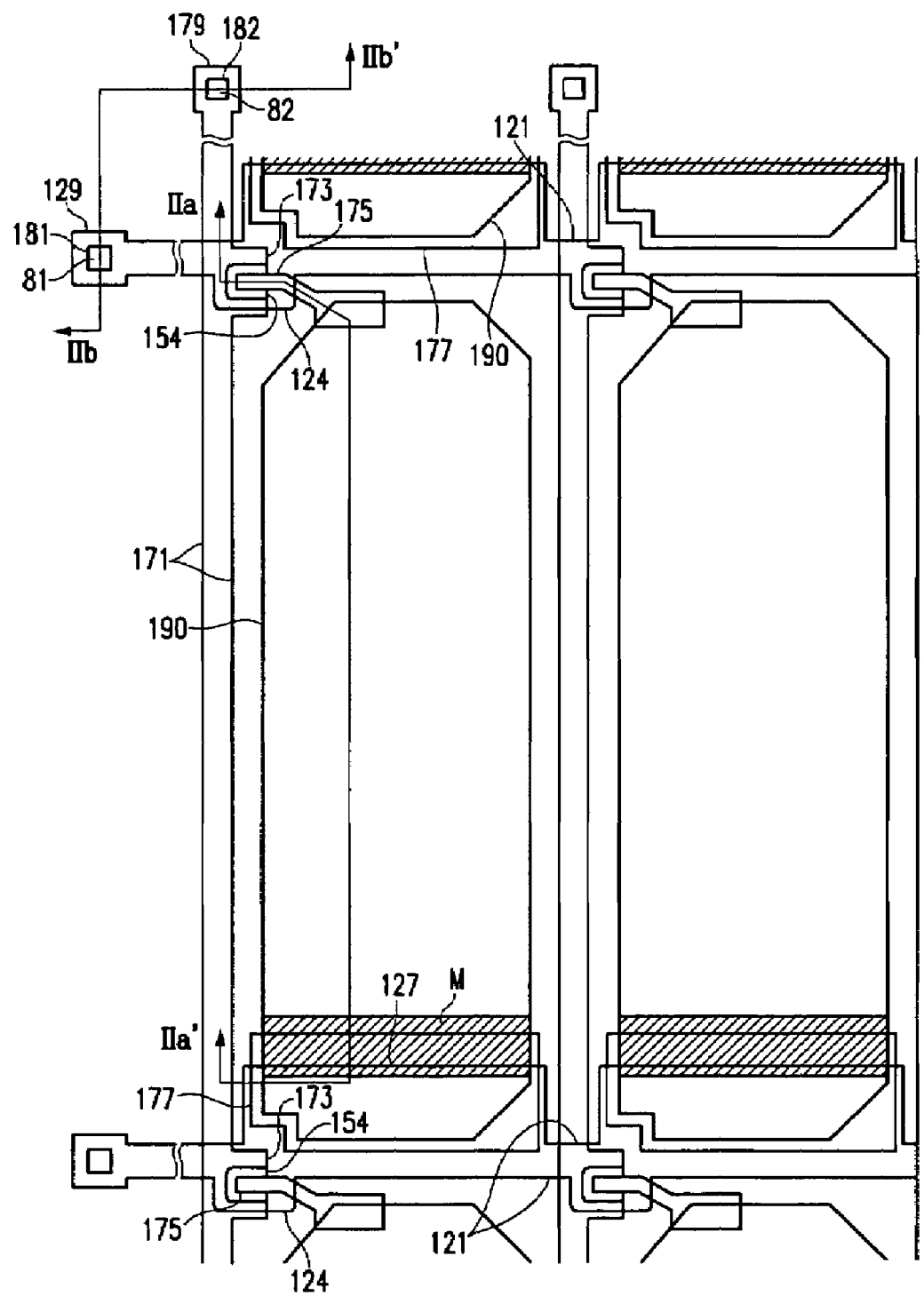
FIG. 1 is a layout view of a TFT array lower panel according to an embodiment of the present invention.

The present invention now will be described more fully hereinafter with reference to the accompanying drawings, in which preferred embodiments of the invention are shown. This invention may, however, be embodied in many different forms and should not be construed as limited to the embodiments set forth herein. Like numerals refer to like elements throughout.

In the drawings, the thickness of layers and regions are exaggerated for clarity. It will be understood that when an element such as a layer, region, or substrate is referred to as being "on" another element, it can be directly on the other element or intervening elements may also be present. In contrast, when an element is referred to as being "directly on" another element, there are no intervening elements present.

TFTs and manufacturing methods thereof according to embodiments of the present invention will now be described with reference to the accompanying drawings.

A TFT array panel according to an embodiment of the present invention will be described in detail with reference to FIGS. 1, 2A, and 2B.

FIG. 1 is a layout view of a TFT array lower panel according to an embodiment of the present invention, FIG. 2A is a sectional view of the TFT array panel shown in FIG. 1 taken along the line IIA-IIA', and FIG. 2B is a sectional view of the TFT array panel shown in FIG. 1 taken along the lines IIB-IIB' and IIB'-IIB".

A plurality of gate lines 121 are formed on an insulating substrate 110 such as transparent glass.

The gate lines 121 extend substantially in a transverse direction to transmit gate signals. Each gate line 121 includes a plurality of gate electrodes 124 projecting downward and projections 127 projecting upward. Each gate line 121 further includes an end portion 129 having a large area for contact with another layer or a driving circuit. The gate lines 121 may extend to be connected to a driving circuit that may be integrated on the TFT array panel.

The gate lines 121 are preferably made of an Al containing metal such as Al and an Al alloy, an Ag-containing metal such as Ag and an Ag alloy, a Cu-containing metal such as Cu and a Cu alloy, a Mo-containing metal such as Mo and an Mo alloy, Cr, Ti, or Ta. The gate lines 121 may have a multi-layered structure including two films having different physical characteristics. One of the two films is preferably made of a low resistivity metal including an Al-containing metal, an Ag-containing metal, and a Cu containing metal for reducing signal delay or voltage drop in the gate lines 121. The other film is preferably made of a material such as a Mo-containing metal, Cr, Ta, or Ti, which have good physical, chemical, and electrical contact characteristics with other materials such as indium tin oxide (ITO) or indium zinc oxide (IZO). Good examples of the combination of the two films are a lower Cr film and an upper Al (alloy) film and a lower Al (alloy) film and an upper Mo (alloy) film. However, they may be made of various metals or conductors.

The lateral sides of the gate lines 121 are inclined relative to a surface of the substrate, and the inclination angle thereof ranges about 30-80 degrees.

A gate insulating layer 140, preferably made of silicon nitride (SiNx), is formed on the gate lines 121.

A plurality of semiconductor stripes and islands 151 and 157, preferably made of hydrogenated amorphous silicon (abbreviated to "a—Si") or polysilicon, are formed on the gate insulating layer 140. Each semiconductor stripe 151 extends substantially in the longitudinal direction and has a plurality of projections 154 branched out toward the gate electrodes 124. Each semiconductor island 157 is separated from the semiconductor stripe 151 and has approximately a rectangular shape.

A plurality of ohmic contact stripes and islands 161, 165, and 167, preferably made of silicide or n+ hydrogenated a—Si heavily doped with n type impurities such as phosphorous, are formed on the semiconductor stripes 151. Each ohmic contact stripe 161 has a plurality of projections 163, and the projections 163 and the ohmic contact islands 165 are located in pairs on the projections 154 of the semiconductor stripes 151. Each ohmic contact island 167 is located near the semiconductor island 157.

The lateral sides of the semiconductor stripes and islands 151 and 157 and the ohmic contacts 161, 165, and 167 are inclined relative to a surface of the substrate, and the inclination angles thereof are preferably in a range of about 30-80 degrees.

A plurality of data lines 171, a plurality of drain electrodes 175 separated from the data lines 171, and a plurality of storage capacitor conductors 177 are formed on the ohmic contacts 161 and 165.

The data lines 171 extend substantially in the longitudinal direction to transmit data voltages and intersect the gate lines 121. Each data line 171 includes an end portion 179 having a large area for contact with another layer or an external device, and a plurality of source electrodes 173 projecting toward the gate electrodes 124.

Each drain electrode 175 has a wide end portion and a linear end portion. The wide end portion has a large area for contact with another layer, and the linear end portion is partly enclosed by a source electrode 173 that is curved.

A gate electrode 124, a source electrode 173, and a drain electrode 175 along with a projection 154 of a semiconductor stripe 151 form a TFT having a channel formed in the projection 154 disposed between the source electrode 173 and the drain electrode 175.

Each storage capacitor conductor 177 overlaps with the projection 127 of the gate line 121.

The data lines 171, the drain electrodes 175, and the storage capacitor conductors 177 are preferably made of a refractory metal such as Cr, Mo, Ti, Ta, or alloys thereof. However, they may have a multilayered structure including a refractory metal film (not shown) and a low resistivity film (not shown). Good example of the multi-layered structure are a double-layered structure including a lower Cr/Mo (alloy) film and an upper Al (alloy) film, and a triple-layered structure of a lower Mo (alloy) film, an intermediate Al (alloy) film, and an upper Mo (alloy) film.

Like the gate lines 121, the data lines 171, the drain electrodes 175, and the storage capacitor conductors 177 have inclined edge profiles, and the inclination angles thereof range about 30-80 degrees.

The ohmic contacts 161, 165, and 167 are interposed only between the underlying semiconductor stripes and islands 151 and 157 and the overlying conductors 171 and 175 and storage capacitor conductors 177 thereon, and reduce the contact resistance therebetween. The semiconductor stripes 151 have almost the same planar shapes as the data lines 171 and the drain electrodes 175 as well as the underlying ohmic contacts 161 and 165. However, the projections 154 of the semiconductor stripes 151 include some exposed portions, which are not covered with the data lines 171 and the drain electrodes 175, such as portions located between the source electrodes 173 and the drain electrodes 175. The semiconductor islands 157 have almost the same planar shapes as the storage capacitor 177 and the underlying ohmic contacts 167.

A passivation layer 180 is formed on the data lines 171, the drain electrodes 175, the storage capacitor conductors 177, and the exposed portions of the semiconductor stripes 151. The passivation layer 180 is preferably made of an inorganic insulator such as silicon nitride or silicon oxide, a photosensitive organic material having a good flatness characteristic, or a low dielectric insulating material that has a dielectric constant lower than 4.0 such as a—Si:C:O and a—Si:O:F formed by plasma enhanced chemical vapor deposition (PECVD). The passivation layer 180 may have a double-layered structure including a lower inorganic film and an upper organic film so that it may have the advantage of the organic film as well as being able to protect the exposed portions of the semiconductor stripes 151.

The passivation layer 180 has a plurality of contact holes 182 exposing parts of the end portions 179 of the data lines 171. The passivation layer 180 and the gate insulating layer 140 have a plurality of contact holes 181 and openings 187 exposing parts of the end portions 129 of the gate lines 121 and areas approximately enclosed by the gate lines 121 and the data lines, respectively. Each opening 187 exposes a portion of the substrate 110. Portions M of the passivation layer 180, which cover near one edge of the storage capacitor conductors 177, may be thinner than other portions thereof.

A plurality of pixel electrodes 190 are formed in the openings 187 and on the portions M of the passivation layer 180, and a plurality of contact assistants 81 and 82 are formed in the contact holes 181 and 182. The pixel electrodes 190 and the contact assistants 81 and 82 are preferably made of a transparent conductor such as ITO or IZO, or a reflective conductor such as Ag or Al.

Boundaries of the pixel electrodes 190 and the contact assistants 81 and 82 are substantially equal to the boundaries of the passivation layer 180 except for the portions M of the passivation layer 180 formed near the one edge of the storage capacitor conductor 177.

The pixel electrodes 190 are physically and electrically connected to the drain electrodes 175 such that the pixel electrodes 190 receive the data voltages from the drain electrodes 175. The pixel electrodes 190 supplied with the data voltages generate electric fields in cooperation with a common electrode (not shown) supplied with a common voltage, which determine the orientations of liquid crystal molecules (not shown) disposed between the two electrodes or yield currents in a light emitting layer (not shown) to emit light.

Concerning an LCD, a pixel electrode 190 and a common electrode form a capacitor called a liquid crystal capacitor, which stores applied voltages after the turn-off of the TFT. An additional capacitor, called a storage capacitor, which is connected in parallel to the liquid crystal capacitor, is provided for enhancing the voltage storing capacity. The storage capacitors are implemented by overlapping the pixel electrodes 190 with the gate lines 121 adjacent thereto (called "previous gate lines"). The capacitances of the storage capacitors are increased by providing the projections 127 at the gate lines 121 for increasing overlapping areas and by providing the storage capacitor conductors 177, which are connected to the pixel electrodes 190 and overlap the projections 127, under the pixel electrodes 190 for decreasing the distance between the terminals.

The contact assistants 81 and 82 have edges substantially equal to the edges of the contact holes 181 and 182, and they are connected to and cover the exposed parts of the end portions 129 of the gate lines 121 and the exposed parts of the end portions 179 of the data lines 171 through the contact holes 181 and 182, respectively. The contact assistants 81 and 82 protect the end portions 129 and 179 and complement the adhesion of the end portions 129 and 179 to external devices.

Now, a method of manufacturing the TFT array panel shown in FIGS. 1-2B according to an embodiment of the present invention will be described in detail with reference to FIGS. 3-12B as well as FIGS. 1-2B.

Figure 3:
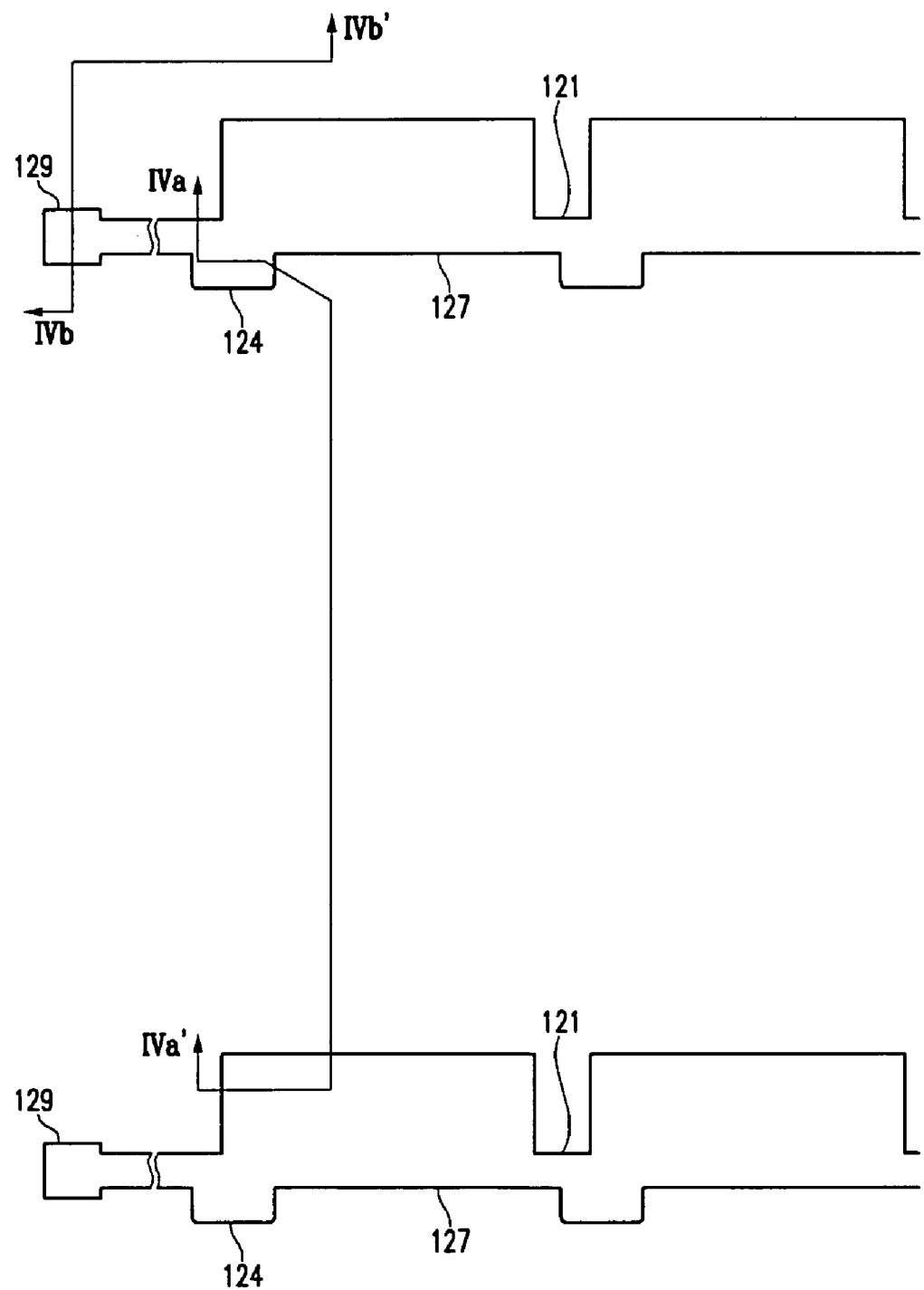
FIGS. 3 and 6 are layout views of a TFT array panel shown in FIGS. 1-2B in intermediate steps of a manufacturing method according to an embodiment of the present invention.
Figure 5A:
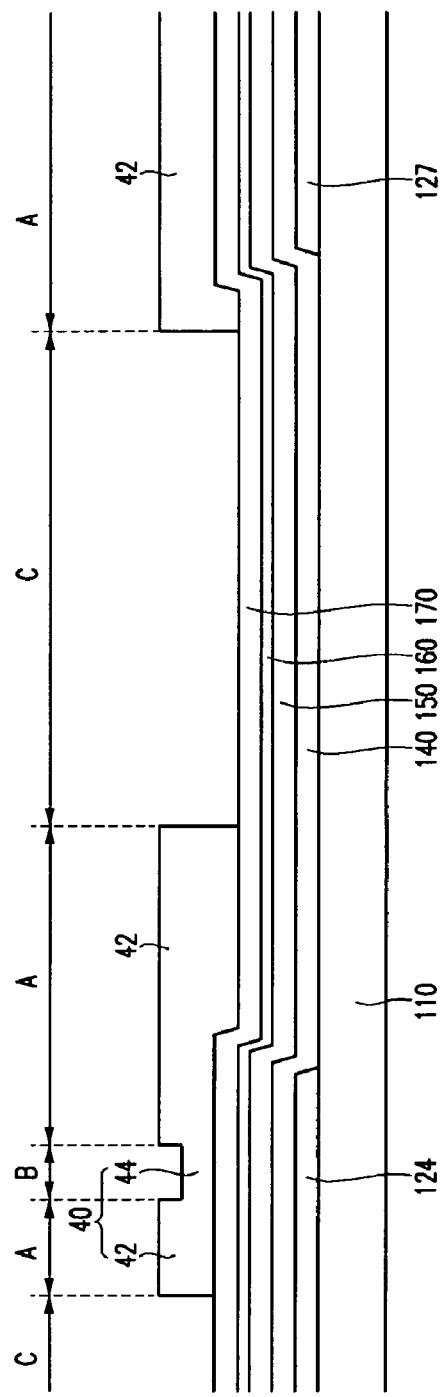
FIGS. 5A and 5B illustrate the step following the step shown in FIGS. 4A and 4B, where
Figure 5B:
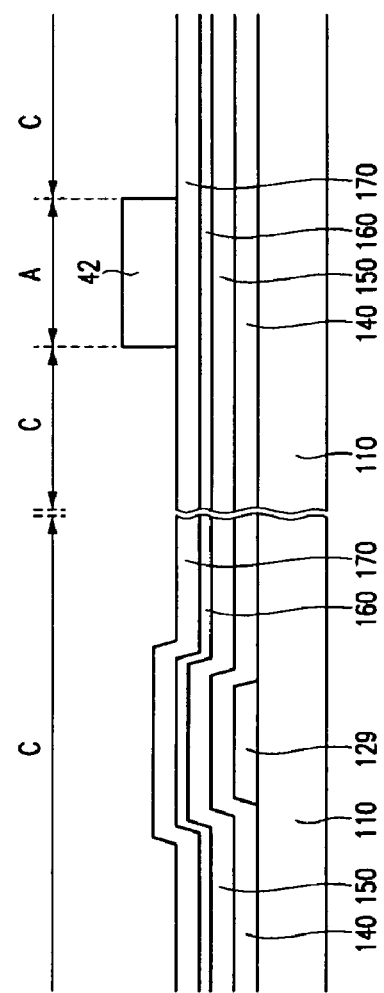
Figure 6:
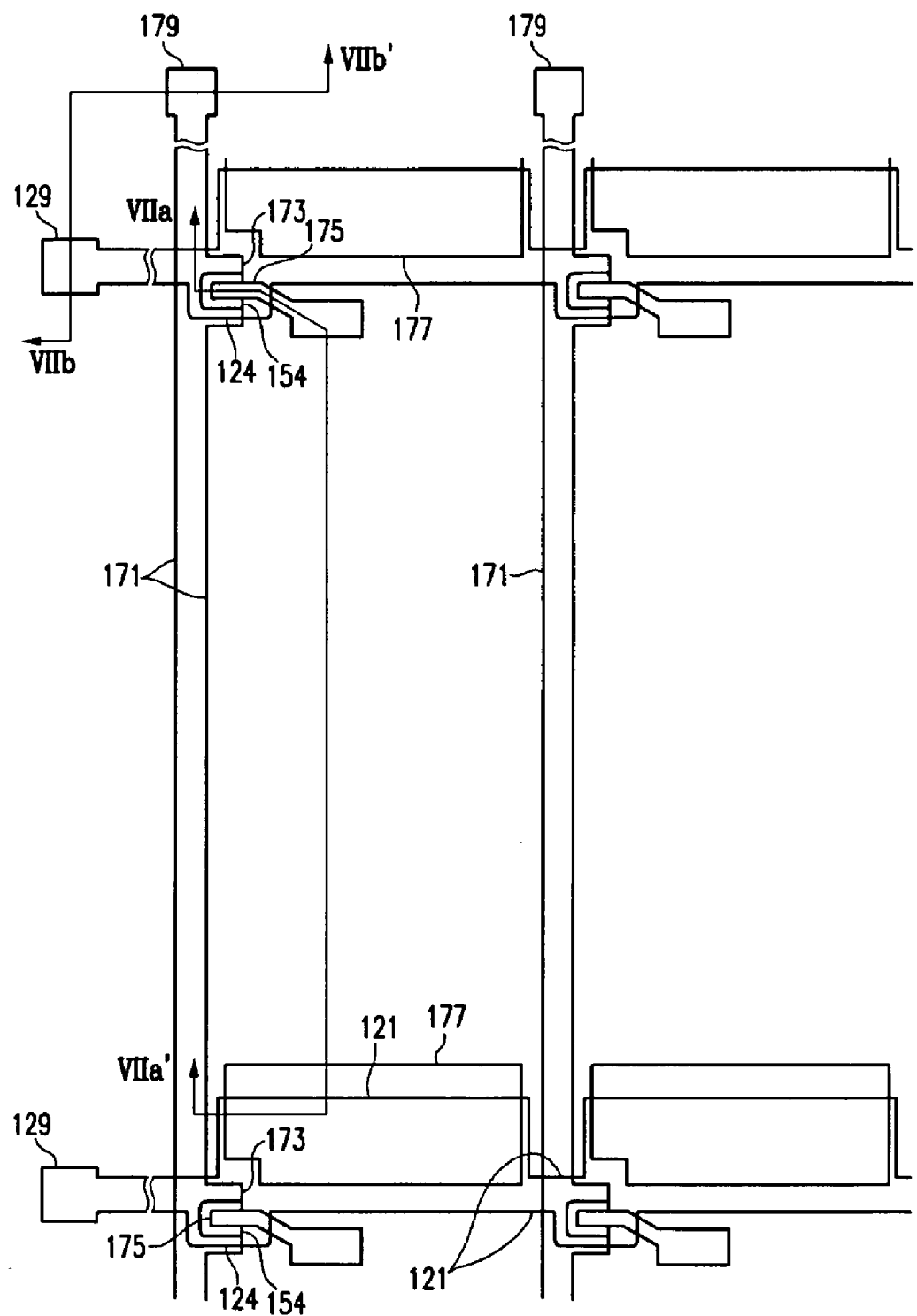
Figure 7A:
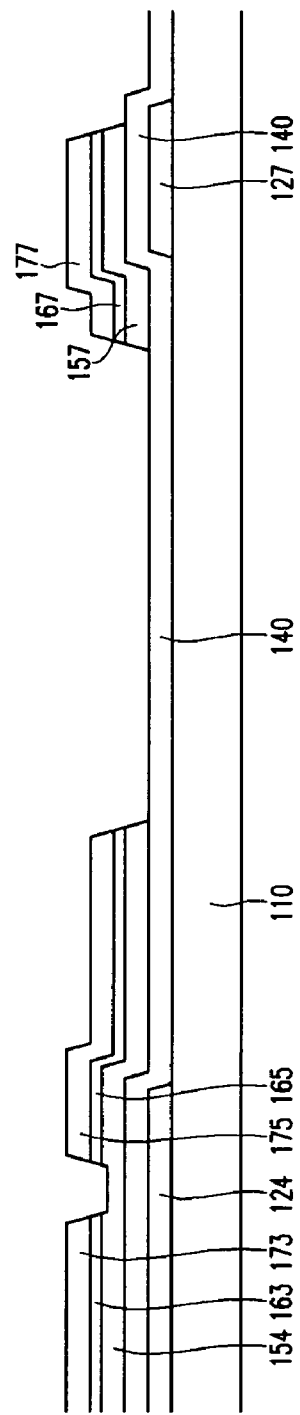
FIG. 7A is a sectional view of the TFT array panel shown in FIG. 6 taken along the line VIIA-VIIA'.
Figure 7B:
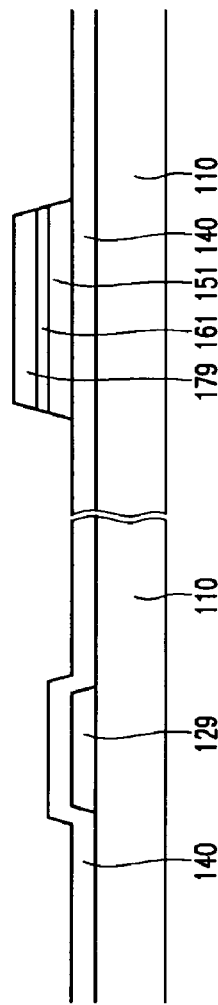
FIG. 7B is a sectional view of the TFT array panel shown in FIG. 6 taken along the lines VIIB-VIIB' and VIIB'-VIIB"
Figure 8A:
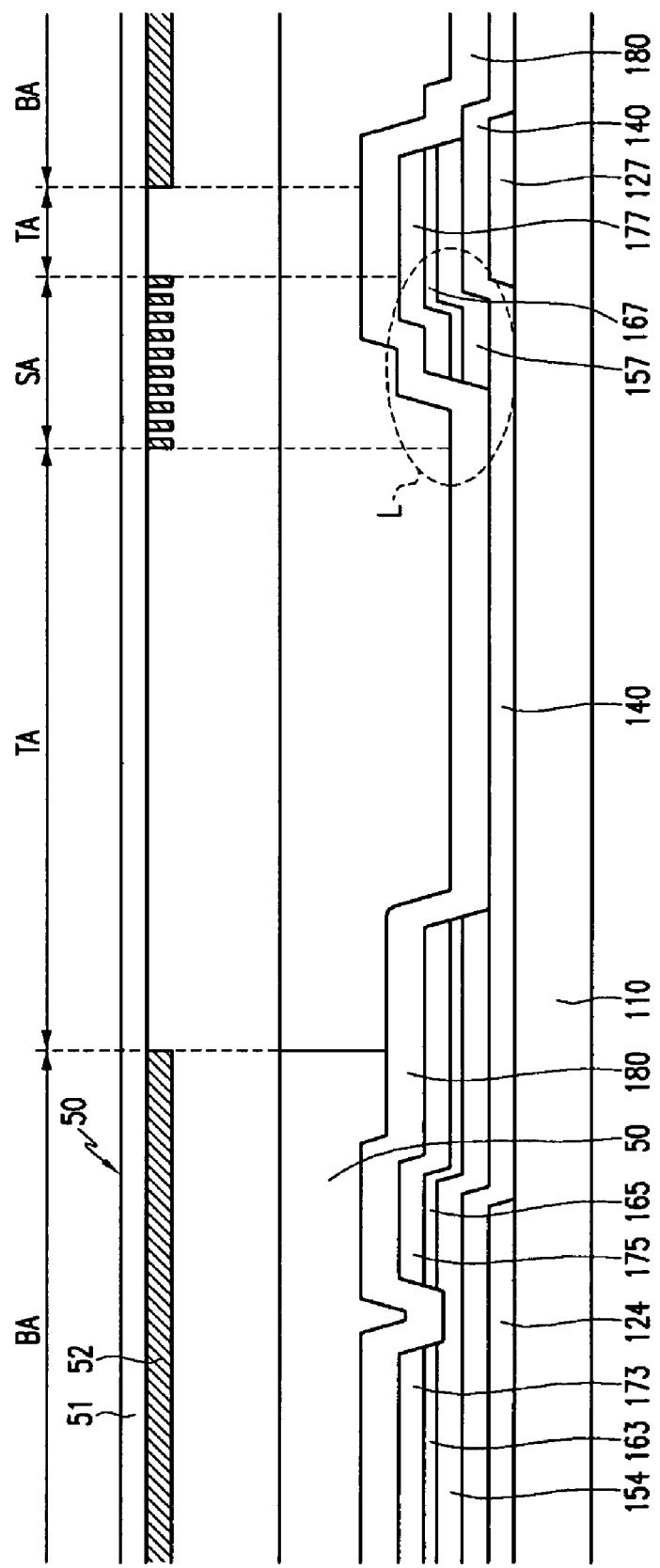
FIGS. 8A and 8B illustrate the step following the step shown in FIGS. 7A and 7B, where
Figure 8B:
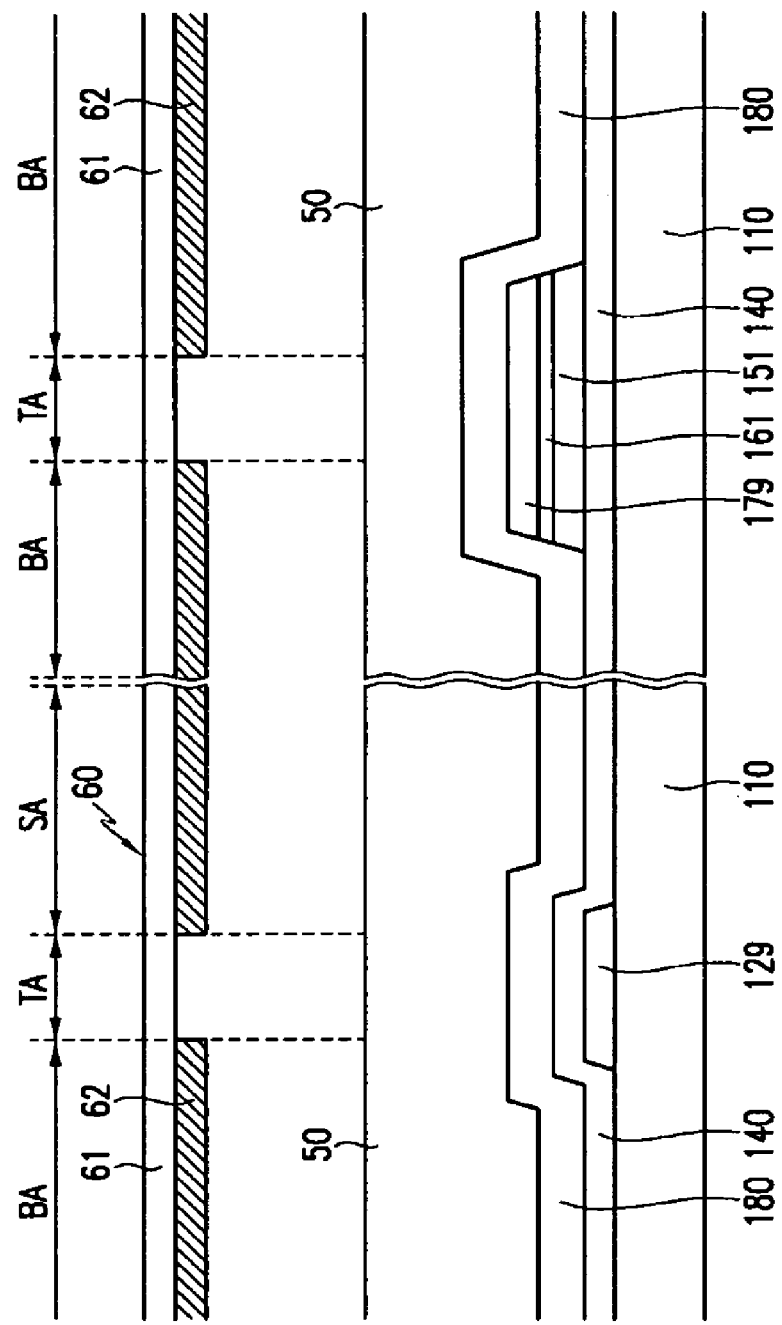
Figure 10A:
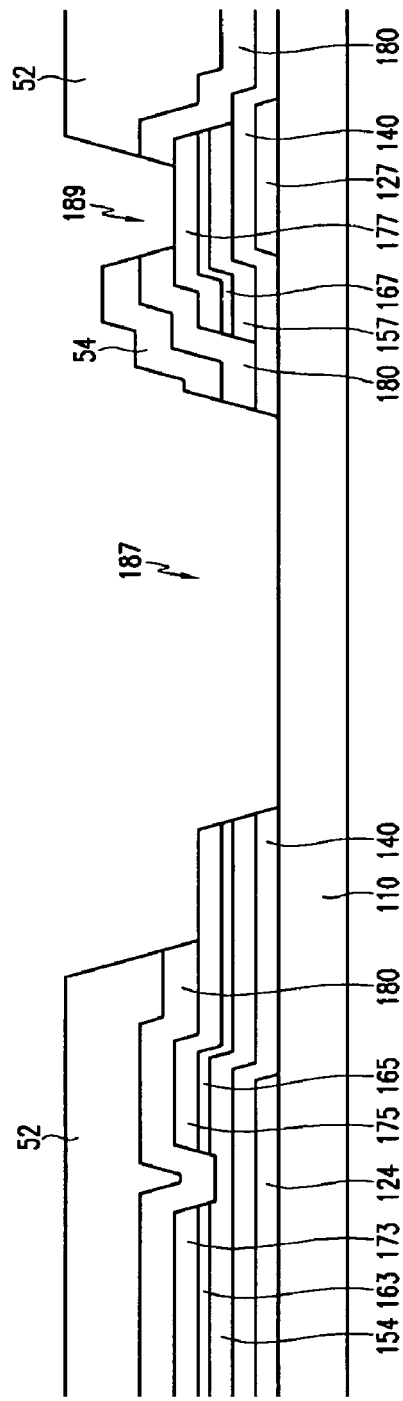
FIGS. 10A and 10B illustrate the step following the step shown in FIGS. 9A and 9B, where
Figure 10B:
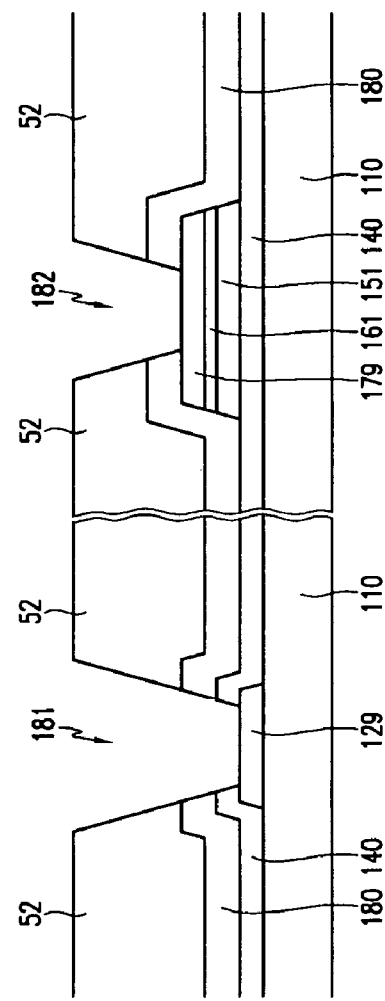
Figure 11A:
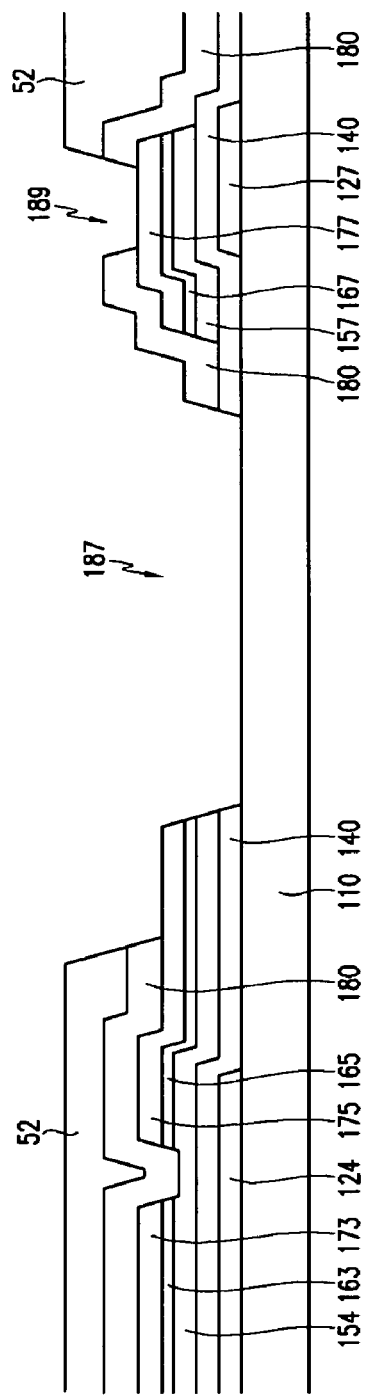
FIGS. 11A and 11B illustrate the step following the step shown in FIGS. 10A and 10B, where
Figure 11B:
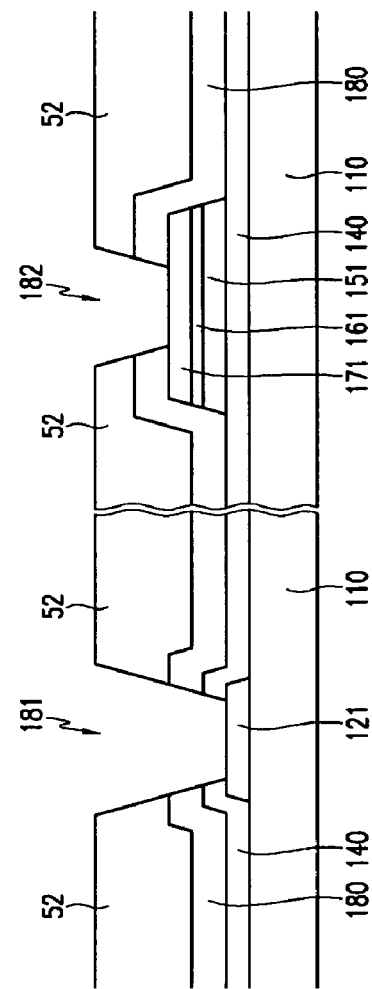

FIGS. 3 and 6 are layout views of a TFT array panel shown in FIGS. 1-2B in intermediate steps of a manufacturing method thereof according to an embodiment of the present invention. FIG. 4A is a sectional view of the TFT array panel shown in FIG. 3 taken along the line IVA-IVA' and FIG. 4B is a sectional view of the TFT array panel shown in FIG. 3 taken along the lines IVB-IVB' and IVB'-IVB". FIGS. 5A and 5B illustrate the step following the step shown in FIGS. 4A and 4B, where FIG. 5A is a sectional view of the TFT array panel shown in FIG. 3 taken along the line IVA-IVA' and FIG. 5B is a sectional view of the TFT array panel shown in FIG. 3 taken along the lines IVB-IVB' and IVB'-IVB". FIG. 7A is a sectional view of the TFT array panel shown in FIG. 6 taken along the line VIIA-VIIA' and FIG. 7B is a sectional view of the TFT array panel shown in FIG. 6 taken along the lines VIIB-VIIB' and VIIB'-VIIB". FIGS. 8A and 8B illustrate the step following the step shown in FIGS. 7A and 7B, where FIG. 8A is a sectional view of the TFT array panel shown in FIG. 6 taken along the line VIIA-VIIA' and FIG. 8B is a sectional view of the TFT array panel shown in FIG. 6 taken along the lines VIIB-VIIB' and VIIB'-VIIB". FIGS. 9A and 9B illustrate the step following the step shown in FIGS. 8A and 8B, where FIG. 9A is a sectional view of the TFT array panel shown in FIG. 6 taken along the line VIIA-VIIA' and FIG. 9B is a sectional view of the TFT array panel shown in FIG. 6 taken along the lines VIIB-VIIB' and VIIB'-VIIB". FIGS. 10A and 10B illustrate the step following the step shown in FIGS. 9A and 9B, where FIG. 10A is a sectional view of the TFT array panel shown in FIG. 6 taken along the line VIIA-VIIA' and FIG. 10B is a sectional view of the TFT array panel shown in FIG. 6 taken along the lines VIIB-VIIB' and VIIB'-VIIB". FIGS. 11A and 11B illustrate the step following the step shown in FIGS. 10A and 10B, where FIG. 11A is a sectional view of the TFT array panel shown in FIG. 6 taken along the line VIIA-VIIA' and FIG. 11B is a sectional view of the TFT array panel shown in FIG. 6 taken along the lines VIIB-VIIB' and VIIB'-VIIB". FIGS. 12A and 12B illustrate the step following the step shown in FIGS. 11A and 11B, where FIG. 12A is a sectional view of the TFT array panel shown in FIG. 6 taken along the line VIIA-VIIA' and FIG. 12B is a sectional view of the TFT array panel shown in FIG. 6 taken along the lines VIIB-VIIB' and VIIB'-VIIB".

Referring to FIGS. 3, 4A, and 4B, a conductive layer preferably made of metal is deposited on an insulating substrate 110 preferably made of transparent glass by sputtering, etc. The conductive layer may have a thickness of about 1500-5000 Å. The conductive layer is then subjected to lithography and etching to form a plurality of gate lines 121 including gate electrodes 124 and the end portion 129.

Referring to FIGS. 5A and 5B, a gate insulating layer 140, an first a—Si layer 150, and a second a—Si layer 160 are sequentially deposited by CVD. The gate insulating layer 140 is preferably made of silicon nitride and has a thickness of about 2000-5000 Å. The deposition temperature of the gate insulating layer 140 is preferably in a range of about 250-450° C.

A conductive layer 170 preferably made of metal is then deposited by sputtering, etc., and a photoresist film 40 with a thickness of about 1-2 microns is coated on the conductive layer 170.

The photoresist film 40 is exposed to light through a photo mask (not shown), and developed such that the developed photoresist has a position dependent thickness. The photoresist shown in FIGS. 5A and 5B includes a plurality of first to third portions in order of decreasing thickness. The first portion located on a wire area A and the second portion located on a channel area B are indicated by reference numerals 42 and 44, respectively. No reference numeral is assigned to the third portion located on the remaining area designated as area C since the photoresist deposited in area C has substantially zero thickness and expose the underlying portions of the conductive layer 170. The thickness ratio of the second portion 44 to the first portion 42 is adjusted depending upon the process conditions in the subsequent process steps. It is preferable that the thickness of the second portion 44 is equal to or less than half of the thickness of the first portions 42, and in particular, equal to or less than 4000 Å.

The position-dependent thickness of the photoresist is achieved by several techniques, for example, by providing translucent areas on the exposure mask as well as light transmitting areas and light blocking opaque areas. The translucent areas may have a slit pattern or a lattice pattern, or be a thin film(s) with intermediate transmittance or intermediate thickness. When using a slit pattern, it is preferable that the width of the slits or the distance between the slits is smaller than the resolution of a light exposer used for the photolithography. Another example is to use reflowable photoresist. In detail, once a photoresist pattern made of a reflowable material is formed by using a normal exposure mask only with transparent areas and opaque areas, it is subject to a reflow process to flow onto areas without the photoresist, thereby forming thin portions.

The different thicknesses of the photoresist 42 and 44 enable selective etching of the underlying layers when using suitable process conditions. Therefore, a plurality of data lines 171 including source electrodes 173 and an end portion 179, and a plurality of drain electrodes 175 and a plurality of storage capacitor conductors 177, as well as a plurality of ohmic contact stripes 161 including projections 163, a plurality of ohmic contact islands 165 and 167, and a plurality of semiconductor stripes 151 including projections 154 and a plurality of semiconductor islands 157 are obtained as shown in FIGS. 6, 7A, and 7B by a series of etching steps.

Portions of the conductive layer 170, the second a—Si layer 160, and the first a—Si layer 150 on the wire areas (area A) are referred to as first portions; portions of the conductive layer 170, the second a—Si layer 160, and the first a—Si layer 150 on the channel areas (area B) are referred to as second portions; and portions of the conductive layer 170, the second a—Si layer 160, and the first a—Si layer 150 on the remaining areas (area C) are referred to as third portion.

An exemplary sequence for forming such a structure is as follows:

(1) Removal of third portions of the conductive layer 170, the second a—Si layer 160, and the first a—Si layer 150 on the wire areas A;

(2) Removal of the second portions 44 of the photoresist;

(3) Removal of the second portions of the conductive layer 170 and the second a—Si layer 160 on the channel areas B; and (4) Removal of the first portions 42 of the photoresist.

Another exemplary sequence is as follows:

(1) Removal of the third portions of the conductive layer 170;

(2) Removal of the second portions 44 of the photoresist;

(3) Removal of the third portions of the second a—Si layer 160 and the first a—Si layer 150 in the area C;

(4) Removal of the second portions of the conductive layer 170;

(5) Removal of the first portions 42 of the photoresist; and (6) Removal of the second portions of the second a—Si layer 160.

The removal of the second portions 44 of the photoresist is performed either simultaneously with or independently from the removal of the third portions of the second a—Si layer 160 and of the first a—Si layer 150. Similarly, the removal of the first portions 42 of the photoresist is performed either simultaneously with or independently from the removal of the second portions of the second a—Si layer 160. For example, a gas mixture of $SF_6$ and HCl or $SF_6$ and $O_2$ may etch the photoresist and the a—Si layers 150 and 160 with substantially equal etch ratios.

Residue of the photoresist remaining on the surface of the conductive layer 170 may be removed by ashing, etc.

Referring to FIGS. 8A and 8B, a passivation layer 180 is deposited and a positive photoresist film 50 is coated thereon. Thereafter, a photo mask 60 is aligned with the substrate 110. The surface of the photoresist film 50 is substantially flat regardless of the height of the underlying passivation layer 180, indicating that the deposition thickness of the photoresist film 50 varies depending on the height of the underlying layer.

The photo mask 60 includes a transparent substrate 61 and an opaque light blocking film 62 and it is divided into light transmitting areas TA, light blocking areas BA, and translucent areas SA. The light blocking film 62 is not disposed on the light transmitting areas TA, but it is disposed on the light blocking areas BA and the translucent areas SA. The light blocking film 62 has a width larger than a predetermined value on the light blocking areas BA, and it exists as a plurality of components having a width or distance that is smaller than a predetermined value, to form slits. The translucent areas SA include portions of edges of the storage capacitor conductors 177; the light transmitting areas TA include the end portions 129 of the gate lines 121, the end portions 179 of the data lines 171, and the areas enclosed by the gate lines 121 and the data lines 171; and the light blocking areas BA face the remaining portions.

Next, referring to FIG. 13, the translucent areas SA of the photo mask 60 will be described in detail.

Figure 13:
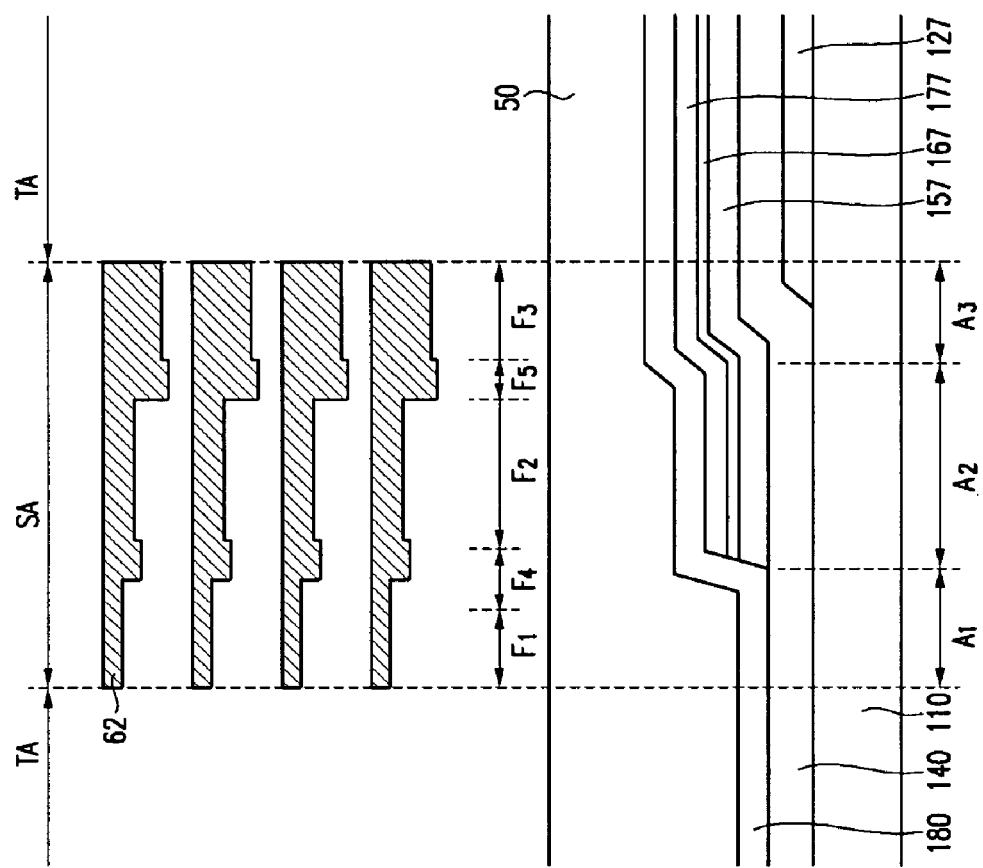
FIG. 13 is a plan view of a portion of a translucent area of a photo mask arranged on an "L" area indicated in FIG. 8A according to an embodiment of the present invention.

FIG. 13 is a plan view of a portion of a translucent area of a photo mask arranged on an "L" area indicated in FIG. 8A according to an embodiment of the present invention.

As shown in FIG. 13, the translucent areas SA of the photo mask 60 include a plurality of light blocking films 62 and a plurality of light transmitting portions 64. The light blocking films 62 are formed on the transparent substrate 61, have a constant interval therebetween and are arranged in parallel with a stripe shape. The respective light transmitting portion 64 exposes the transparent substrate 61 and has a slit shape. The vertical width of each light blocking film 62 is not constant and is different corresponding to positions, such that transmittance of light passing through the translucent areas SA varies based on the widths. Thereby, since the light transmitting portions 64 have different vertical widths corresponding to positions, the translucent areas SA of the photo mask 60 have a differential slit construction.

As described above with reference to FIGS. 8A and 8B, the thickness of the photoresist film 50 is varied based on the height of the underlying layers. For example, the thickness of the photoresist film 50 formed on portions A1 on which the storage capacitor conductors 177 are not formed, the thickness of the photoresist film 50 formed on portions A2 on which the storage capacitor conductors 177 are formed, and the thickness of the photoresist film 50 formed on portions A2 on which the projections 127 of the gate lines are formed, are different. The thickness of the photoresist film 50 on portion A1 is the thickest and the thickness of the photoresist film 50 on portion A3 is the thinnest.

Thus, as shown in FIG. 13, the light blocking film 62 is patterned with translucent areas F1, F2, and F3 that approximately correspond to the areas A1, A2, and A3, respectively. The patterns cause different light transmittance levels in the translucent areas F1, F2, and F3.

In detail, the widths the light blocking films 62 of the translucent area F1 approximately corresponding to the area A1 are formed to be the narrowest t, the widths the light blocking films 62 of the translucent area F3 approximately corresponding to the area A3 are formed to be the widest, and the widths the light blocking films 62 of the translucent area F2 approximately corresponding to the area A2 are formed to be between the aforementioned two widths. The amount of light that passes through each of the areas F1 through F5 depends on the widths of the light blocking films 62 in the respective regions. Accordingly, the amount of light passing through the translucent area F1 is more than that of light passing through the translucent area F2, and the amount of light passing through the translucent area F2 is more than that of light passing through the translucent area F3, to gradually decrease an exposed amount of the photoresist film 50. In addition, at portions near the edges of the storage capacitor conductors 177 and portions near the edges of the expansions 127 of the gate lines, the underlying layers may be exposed due to overexposure of the photoresist film 50. Thus, to avoid the exposure of the underlying layers, the amount of exposed light is decreased. To achieve this, the widths the light blocking films 62 of the translucent areas F4 and F5 corresponding to the edges of the storage capacitor conductors 177 and the expansions 127 of the gate lines, respectively, are formed to be wider than those of the light blocking films 62 of the remaining translucent areas F1, F2, and F3, to decrease the amount of light passing through the areas F4 and F5.

The light transmittance is related to the interval between the adjacent light blocking films 62 as well as their widths. Thus, the light transmittance is adjusted by varying the interval between the adjacent light blocking films 62. That is, as the interval between the adjacent light blocking films 62 becomes wider, the light transmittance increases. In contrast, as the interval between the adjacent light blocking films 62 become narrower, the light transmittance decreases.

Moreover, light passing through the light transmitting areas TA influence the adjacent areas such as the light blocking areas BA or the translucent areas SA.

Light passing through the transmitting areas TA is received at the light blocking areas BA or the translucent areas SA, to influence the exposed amount of the photoresist film 50 corresponding to the areas BA and SA. Thus, the widths of the light blocking areas BA are defined based on the exposed amount of the photoresist film 50 due to the adjacent light transmitting areas TA. For example, since the light transmitting area TA is adjacent to the translucent areas F1 on a left side, the intensity of light input through the adjacent light transmitting areas TA increases as the width of the light blocking areas BA of the translucent area F1 decreases. Consequently, the exposed amount of the photoresist film 50 increases.

The photoresist 50 is exposed to light through the photo mask 60, and it is developed such that portions of the photoresist 50 that received a predetermined amount of light are removed. Referring to FIGS. 9A and 9B, portions of the photoresist 50 facing the light transmitting areas TA are removed, portions 54 of the photoresist 50 facing the translucent areas SA come to have a reduced thickness, and portions 52 of the photoresist 50 facing the light blocking areas BA are left. As described above, the thickness of the remaining photoresist film 52 is made substantially constant regardless of the height of the underlying passivation layer 180 by varying the exposed amount of the photoresist film 50 based on the thicknesses thereof.

Referring to FIGS. 10A and 10B, the passivation layer 180 and the gate insulating layer 140 are etched using the remaining portions 52 and 54 of the photoresist 50 as an etch mask to form a plurality of contact holes 181, 182, and 189 and openings 187 exposing the end portions 129 of the gate lines 121, the end portions 179 of the data lines 171, portions of the storage capacitor conductors 177, and portions enclosed by the gate lines 121 and the data lines 171, respectively. Preferably, the etching is done without etching the remaining portions 52 and 54 of the photoresist 50, and to create a slope at the edges of the passivation layer 180 and the photoresist films 52 and 54.

Referring to FIGS. 11A and 11B, the thin portions 54 (see FIG. 10A) of the photoresist 50 are removed by ashing, etc., and the thickness of the thick portions 52 is decreased. At this time, the thickness of portions M of the passivation layer 180 formed near one edge of the storage capacitor conductors 177 is decreased to have a predetermined thickness.

Referring to FIGS. 12A and 12B, a conductive film 90 preferably made of IZO, ITO, or amorphous ITO is deposited by sputtering, etc.

The conductive film 90 includes a first portion 91 disposed on the photoresist 52 and a second portion 92 including the remaining portions. The first portion 91 and the second portion 92 of the conductive film 90 are separated from each other at least in part to form gaps therebetween, and to expose the lateral sides of the photoresist 52 at least in part.

The substrate 110 is then dipped into a developer such that the developer infiltrates into the photoresist 52 through the exposed lateral sides of the photoresist 52 to remove the photoresist 52. When this is done, the first portion 91 of the conductive film 90 disposed on the photoresist 52 is removed along with the photoresist 52 in a process that is referred to as "lift-off." As a result, only the second portion 92 of the conductive film 90 is left to form the plurality of pixel electrodes 190 and the plurality of contact assistants 81 and 82 as shown in FIGS. 1, 2A, and 2B.

At this time, since the edges of the storage capacitor conductors 177 are at least partially covered with the passivation layer 180, the undercut does not occur under the edges of the storage capacitor conductors 177 to prevent disconnections between the pixel electrode 190 and the storage capacitor conductors 177. Meanwhile, unlike in FIGS. 9A to 11B, the exposed passivation layer 180, the photoresist films 54, and the gate insulating layer 140 underlying the exposed passivation layer 180 may be simultaneously etched by selecting appropriate etching conditions. In this case, the etching is subjected until all the gate insulating layer 140 is etched, and by appropriately selecting the thickness of the photoresist 54, it is preferable that some passivation layer 180 under the photoresist film 54 remains.

To prevent disconnection between the pixel electrodes 190 and the storage capacitor conductors 177 due to the undercut, the slit masks are used near edges of the storage capacitor conductors 177, but the slit masks may also be used near edges of the drain electrodes 175 to prevent disconnection between the drain electrodes 175 and the pixel electrodes 190. In this case, since light transmittance of the slit masks varies depending on the thickness of the formed photoresist film 50, the thickness of the remaining photoresist film 50 is substantially constant after light exposure independent of the underlying layers.

Next, referring to FIG. 14, translucent areas SA of a photo mask 60 according to another embodiment of the present invention will be described.

FIG. 14 is a plan view of a portion of a translucent area of photo mask arranged on an "L" area according to another embodiment of the present invention.

As shown in FIG. 14, translucent areas SA according to another embodiment of the present invention include a plurality of light blocking portions 62' formed on the transparent substrate 61 and having a rectangular shape. The size such as horizontal width and vertical width, the interval, the arrangement shape, and the density of each light blocking portion 62' may be varied, and light transmittance of the translucent areas SA is based thereon. Accordingly, the light blocking portions 62' are formed depending on the thickness of the photoresist film 50 to be removed. As stated above, the shape of the light blocking portions 62' is rectangular, but may be circular, elliptical, triangular, or lozenged. Alternatively, the light blocking portions 62' may be light transmitting portions. The photoresist film 50 is exposed to light through the photo mask 60, and it is developed such that the photoresist film 50 has a profile that is substantially equal to that of the underlying layer by finely adjusting the amount of light available based on the size, the interval, the arrangement shape, and the density of the light blocking portions.

As described above, the pixel electrodes and the contact holes connecting the drain electrodes and the pixel electrodes are formed using one lithography step. Accordingly, a lithography step for forming the pixel electrodes is omitted to simplify the manufacturing method, thereby reducing the manufacturing time and the cost.

The photo mask has different shapes depending on the desired thickness of the photoresist film to be formed in the translucent areas. Photoresist films of different thicknesses allow different amounts of light to pass through the translucent areas. Since the thickness of the photoresist film that remains after light exposure is constant, the process margin of subsequent processes is increased. In addition, the reliability of the manufacturing processes of the TFT array panel is improved.

Although preferred embodiments of the present invention have been described in detail hereinabove, it should be clearly understood that many variations and/or modifications of the basic inventive concepts herein taught which may appear to those skilled in the present art will still fall within the spirit and scope of the present invention, as defined in the appended claims.

What is claimed is:

1. A method of manufacturing a thin film transistor array panel, the method comprising:
    forming a gate line on a substrate;
    forming a first insulating layer on the gate line;
    forming a semiconductor layer on the first insulating layer;
    forming a data line, a drain electrode, and a storage capacitor conductor on the semiconductor layer;
    depositing a second insulating layer on the data line, the drain electrode, and the storage capacitor conductor;
    forming a photoresist including a first portion and a second portion to be thinner than the first portion on the second insulating layer by exposing it to light through a photo mask and developing;
    etching the second and first insulating layers using the photoresist as a mask to expose portions of the drain electrode and the storage capacitor conductor and to leave a first portion of the second insulating layer under the second portion of the photoresist;
    removing the second portion of the photoresist;
    depositing a conductive film; and
    removing the second portion of the photoresist to form a pixel electrode connected to the drain electrode and the storage capacitor conductor,
    wherein the photo mask include a light blocking area, a transmitting area, and a translucent area, and
    wherein the translucent area includes a plurality of light blocking portions having a plurality of areas at which amounts of light blocked are different from each other.

2. The method of claim 1, wherein the respective light blocking portions have a stripe shape.

3. The method of claim 2, wherein the respective areas of the light blocking portions have different vertical widths.

4. The method of claim 3, wherein the respective light blocking portions comprise:
    a first area corresponding to a portion adjacent to where a near edge of the storage capacitor conductor is not formed;
    a second area corresponding to an area near the edge of the storage capacitor conductor;
    a third area corresponding to a portion of the storage capacitor conductor;
    a fourth area corresponding to an area near an edge of an expansion of the gate line; and
    a fifth area corresponding to a portion of the expansion of the gate line.

5. The method of claim 4, wherein the first area has the narrowest vertical width.

6. The method of claim 4, wherein the second portion of the photoresist film is positioned near the edge of the storage capacitor conductor.

7. The method of claim 1, wherein the photo mask varies an amount of light blocked by adjusting an interval between adjacent light blocking portions.

8. The method of claim 1, wherein the etching of the second and first insulating layers exposes portions of the data line.

9. The method of claim 1, wherein the etching of the second and first insulating layers exposes a portion of the gate line.

10. The method of claim 1 wherein the second portion of the photoresist is positioned near an edge of the storage capacitor conductor.

11. A method of manufacturing a thin film transistor array panel, the method comprising:
    forming a gate line on a substrate;
    forming a first insulating layer on the gate line;
    forming a semiconductor layer on the first insulating layer;
    forming a data line, a drain electrode, and a storage capacitor conductor on the semiconductor layer;
    depositing a second insulating layer on the data line, the drain electrode, and the storage capacitor conductor;
    forming a photoresist including a first portion and a second portion thinner than the first portion on the second insulating layer by exposing it to light through a photo mask and developing;
    etching the second and first insulating layers using the photoresist as a mask to expose portions of the drain electrode and the storage capacitor conductor and to leave a first portion of the second insulating layer under the second portion of the photoresist;
    removing the second portion of the photoresist;
    depositing a conductive film; and
    removing the second portion of the photoresist, to form a pixel electrode connected to the drain electrode and the storage capacitor conductor,
    wherein the photo mask include a light blocking area, a transmitting area, and a translucent area, and
    wherein the translucent area has a plurality of light blocking portions which have a predetermined size and are arranged in a matrix.

12. The photo mask of claim 11, wherein the light blocking portions have different sizes from each other.

13. The photo mask of claim 12, wherein the respective light blocking portions have a circular shape.

14. The photo mask of claim 11, wherein the light blocking portions have the same size and have different formation densities in accordance with formation position.

15. The photo mask of claim 11, wherein the respective light blocking portions have a polygon shape.

16. The photo mask of claim 15, wherein the respective light blocking portions have a rectangular shape.

17. The method of claim 11, wherein the etching of the second and first insulating layers exposes portions of the data line and the drain electrode.

18. The method of claim 11, wherein the etching of the second and first insulating layers exposes a portion of the gate line.

* * * * *